United States Patent
Takeya et al.

(10) Patent No.: US 9,379,341 B2
(45) Date of Patent: Jun. 28, 2016

(54) ORGANIC THIN FILM TRANSISTOR AND METHOD FOR PRODUCING SAME

(71) Applicant: OSAKA UNIVERSITY, Suita-shi, Osaka (JP)

(72) Inventors: Junichi Takeya, Suita (JP); Takafumi Uemura, Suita (JP)

(73) Assignee: Osaka University, Osaka (JP)

(*) Notice: Subject to any disclaimer, the term of this patent is extended or adjusted under 35 U.S.C. 154(b) by 0 days.

(21) Appl. No.: 14/423,401

(22) PCT Filed: Aug. 19, 2013

(86) PCT No.: PCT/JP2013/072110
§ 371 (c)(1),
(2) Date: Feb. 23, 2015

(87) PCT Pub. No.: WO2014/030613
PCT Pub. Date: Feb. 27, 2014

(65) Prior Publication Data
US 2015/0188063 A1    Jul. 2, 2015

(30) Foreign Application Priority Data

Aug. 24, 2012 (JP) .................................. 2012-185621

(51) Int. Cl.
| H01L 51/00 | (2006.01) |
| H01L 51/05 | (2006.01) |
| H01L 51/10 | (2006.01) |

(52) U.S. Cl.
CPC ........ H01L 51/0545 (2013.01); H01L 51/0554 (2013.01); H01L 51/105 (2013.01); *H01L 51/0021* (2013.01)

(58) Field of Classification Search
CPC ............ H01L 51/0545; H01L 51/0036; H01L 51/0541; H01L 51/5012
USPC .......................................................... 257/40
See application file for complete search history.

(56) References Cited

U.S. PATENT DOCUMENTS

| 8,723,166 B2* | 5/2014 | Park ..................... H01L 27/3272 257/40 |
| 2010/0283054 A1 | 11/2010 | Hirano et al. |
| 2013/0168677 A1 | 7/2013 | Hirano et al. |

FOREIGN PATENT DOCUMENTS

| JP | 9-186332 | 7/1997 |
| JP | 2007-243001 | 9/2007 |
| JP | 2010-135542 | 6/2010 |
| JP | 2011-101030 | 5/2011 |
| WO | WO 2011/052058 | 5/2011 |

OTHER PUBLICATIONS

Nakayama et al.: "Reduced contact resistances in organic transistors with secondary gates on source and drain electrodes"; Applied Physics Letters, 95, 113308 (2009), http://dx.doi.org/10.1063/1.3231927 (4 pages).

* cited by examiner

*Primary Examiner* — Quoc Hoang
(74) *Attorney, Agent, or Firm* — Hamre, Schumann, Mueller & Larson, P.C.

(57) ABSTRACT

An organic thin film transistor includes an insulating substrate (1), gate electrodes (2, 4), a gate insulating film (3), an organic semiconductor film (5), and a source electrode (6) and a drain electrode (7). The gate electrodes include a main gate electrode (2) that is disposed in a region opposed to a channel region between the source electrode and the drain electrode in the organic semiconductor film, and a pair of auxiliary gate electrodes (4) that are disposed in respective regions opposed to the source electrode and the drain electrode on the two sides of the main gate electrode. The main gate electrode and the auxiliary gate electrodes are electrically separated from each other. The contact resistance between the source and drain electrodes and the organic semiconductor film is controlled so as to be at a low level even when the organic thin film transistor is driven in a low voltage region, and the operation frequency can be sufficiently enhanced due to the channel length being shortened.

8 Claims, 7 Drawing Sheets

ORGANIC THIN FILM TRANSISTOR AND METHOD FOR PRODUCING SAME

TECHNICAL FIELD

The present invention relates to an organic thin film transistor using an organic semiconductor in an active layer. In particular, the present invention relates to an organic thin film transistor having an element structure that is suitable for shortening a channel length to enhance an operation frequency, and a method for producing the same.

BACKGROUND ART

An organic semiconductor thin film can be formed by application of a solution. Therefore, an organic thin film transistor (organic TFT) is less expensive and has lower environmental loads than a conventional TFT using an inorganic semiconductor, and an electronic element having a large area can be produced using the organic thin film transistor. Furthermore, an organic device using the organic TFT is light in weight and flexible, and thus can be used widely in various devices such as a display and an IC tag.

However, the operation frequency of the current organic TFT is not yet sufficiently high compared with that of an inorganic TFT, and an enhancement of the operation frequency is desired. It is necessary to realize a short channel length L and a high mobility in order to enhance the operation frequency of a transistor. However, it is known that in fact, as the channel length L is shortened, the influence of contact resistance at the interface between an electrode and the organic semiconductor increases, and an effective mobility decreases.

For example, Patent Document 1 discloses that an alloy containing gold as a main component is used in a contact layer provided between source and drain electrodes that are made of gold and an insulating substrate in order to reduce contact resistance at the interface between the electrode and the organic semiconductor. That is, an alloy containing gold in an amount within a range of 67 atomic % or more to 97 atomic % or less is used.

Although gold often is used as a material for forming source and drain electrodes of an organic transistor of p-type operation, gold has low adhesion to other materials Therefore, a countermeasure is carried out in general in which a contact layer is formed between the gold electrode and the substrate. However, it has been pointed out that the contact layer causes parasitic resistance between the source and drain electrodes and the organic semiconductor layer.

To address this, Patent Document 1 states that it is possible to reduce parasitic resistance between the organic semiconductor layer and the electrodes by using the above-described alloy containing gold to form a contact layer.

PRIOR ART DOCUMENTS

Patent Document

[Patent Document 1] JP 2010-135542A

DISCLOSURE OF INVENTION

Problem to be Solved by the Invention

However, even in the organic TFT disclosed in Patent Document 1, the effective mobility is as low as about 0.4 to 2.2 cm$^2$/Vs, and it is difficult to enhance the operation frequency sufficiently compared with that of an inorganic TFT.

On the other hand, it is known that a common organic TFT has a property in which contact resistance decreases as gate voltage increases. However, when the gate voltage is low, the contact resistance is high, and the operation frequency is low.

Therefore, it is an object of the present invention to provide an organic thin film transistor in which the contact resistance between the source and drain electrodes and the organic semiconductor film is controlled so as to be at a low level even when driven in a low voltage region, and the operation frequency can be enhanced sufficiently due to the channel length being shortened. Also, it is an object thereof to provide a production method in which such an organic thin film transistor can be produced accurately.

Means for Solving the Problem

In order to solve the foregoing problems, an organic thin film transistor of the present invention includes an insulating substrate, gate electrodes provided on the substrate, a gate insulating film formed so as to cover the gate electrodes, an organic semiconductor film formed on the gate insulating film, and a source electrode and a drain electrode that are disposed so as to come into contact with the organic semiconductor film, wherein the gate electrodes include a main gate electrode that is disposed in a region opposed to a channel region between the source electrode and the drain electrode in the organic semiconductor film, and a pair of auxiliary gate electrodes that are disposed in respective regions opposed to the source electrode and the drain electrode on the two sides of the main gate electrode, and the main gate electrode and the auxiliary gate electrodes are electrically separated from each other.

A production method of the present invention is a method for producing the organic thin film transistor with the above-described configuration, and the method includes forming, out of the main gate electrode and the auxiliary gate electrodes, one gate electrode on the insulating substrate, forming a lower gate insulating film so as to cover the one gate electrode, forming the other gate electrode on the lower gate insulating film, forming an upper gate insulating film so as to cover the other gate electrode and the lower gate insulating film, and forming an organic semiconductor film on the upper gate insulating film and forming a source electrode and a drain electrode so as to be in contact with the organic semiconductor film.

Effects of the Invention

Channel resistance and contact resistance are controlled with a main gate electrode and auxiliary gate electrodes that are separate from each other, and thus the organic thin film transistor configured as described above can operate in a state in which the contact resistance is suppressed to a low level even when driven in a low voltage region. Therefore, the effective mobility can be increased, and the organic thin film transistor can be driven with a sufficiently high operation frequency due to the channel length being shortened.

Moreover, with the method configured as described above for producing an organic thin film transistor, a main gate electrode and auxiliary gate electrodes are formed in separate steps, and a step of forming a lower gate insulating film is performed between the step of forming the main gate electrode and the step of forming the auxiliary gate electrodes. This makes it easy to obtain a structure in which the main gate electrode and the auxiliary gate electrodes are separated from each other in an appropriate state.

DESCRIPTION OF THE INVENTION

Figure 1:
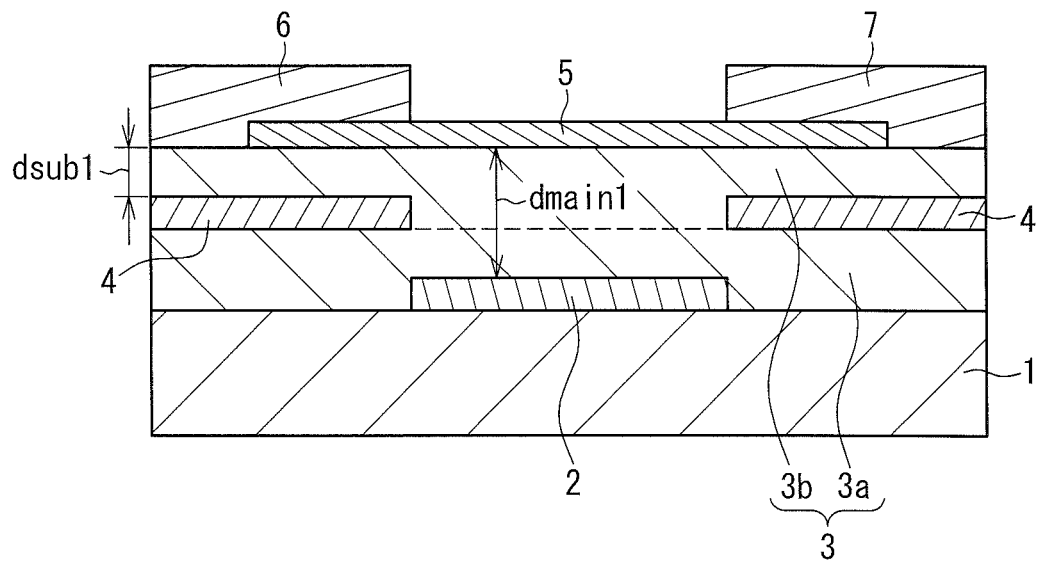
FIG. 1 is a cross-sectional view illustrating the structure of an organic TFT according to Embodiment 1.

An organic thin film transistor of the present invention can take the following embodiments based on the above-described configuration.

That is, the organic thin film transistor can be configured such that the thickness of the gate insulating film present between the main gate electrode and the organic semiconductor film is different from that of the gate insulating film present between the auxiliary gate electrodes and the organic semiconductor film, and the gate insulating film is present between the main gate electrode and the auxiliary gate electrodes.

Also, the organic thin film transistor can be configured such that a constant voltage is applied to the auxiliary gate electrodes, and relationships between the thickness of the gate insulating film and voltages applied to the auxiliary gate electrodes and the main gate electrode are set so that an electric field between the auxiliary gate electrodes and the organic semiconductor film is stronger than an electric field between the main gate electrode and the organic semiconductor film.

Moreover, it is preferable that the main gate electrode and the auxiliary gate electrodes are formed such that there is no gap between end portions thereof when viewed in a direction orthogonal to the organic semiconductor film. In other words, the end portions of the main gate electrode and the auxiliary gate electrodes may slightly overlap each other. It is particularly preferable that the main gate electrode and the auxiliary gate electrodes are formed such that there is no area in which the main gate electrode and the auxiliary gate electrodes overlap each other when viewed in a direction orthogonal to the organic semiconductor film. With this configuration, it is possible to obtain an organic thin film transistor that can suppress parasitic capacitance of a gate electrode to a low level and be driven with sufficiently high operation frequency due to the channel length being shortened.

A method for producing an organic thin film transistor of the present invention can take the following embodiments based on the above-described configuration.

That is, in the second gate forming step, the other gate electrode is patterned in a self-aligned manner with respect to the one electrode by a step including a back exposure from the back surface side of the substrate, the back exposure using the gate electrode formed in the first gate forming step as a mask. This makes it easy to achieve an optimum state in which there is no overlapping region and no gap between the two gates.

Also, it is possible that the gate insulating film is formed by separately forming a lower insulating film and an upper insulating film, the lower insulating film is formed so as to cover the one gate electrode after the first gate forming step, the other gate electrode is then formed on the lower insulating film by the second gate forming step, and the upper insulating film is then formed so as to cover the other gate electrode.

Hereinafter, embodiments of the present invention will be described with reference to the drawings.

Embodiment 1

FIG. 1 is a cross-sectional view illustrating the structure of an organic TFT according to Embodiment 1. A main gate electrode 2 is provided on an insulating substrate 1, and a lower insulating film 3a is formed so as to cover the main gate electrode 2. Auxiliary gate electrodes 4 are formed on the upper surface of the lower insulating film 3a, and an upper insulating film 3b is formed so as to cover the upper surfaces of the auxiliary gate electrodes 4. A gate insulating film 3 is constituted by the lower insulating film 3a and the upper insulating film 3b. This configuration makes it possible to achieve a state in which the main gate electrode 2 and the auxiliary gate electrodes 4 are disposed in the gate insulating film 3 so as to be electrically separated from each other. An organic semiconductor film 5 is formed on the upper surface of the upper insulating film 3b covering the auxiliary gate electrodes 4, and a source electrode 6 and a drain electrode 7 are provided so as to be in contact with the organic semiconductor film 5.

This organic TFT has a top contact type structure in which the source electrode 6 and the drain electrode 7 are formed on the organic semiconductor film 5. Generally, element structures of organic TFTs are classified roughly into two types including a top contact type structure and a bottom contact type structure. As described later, the features of the organic TFT of this embodiment can be applied similarly to the bottom contact type structure, that is, a structure in which a source electrode and a drain electrode are formed under the lower portion of an organic semiconductor film.

The main gate electrode 2 is disposed in a region opposed to a channel region between the source electrode 6 and the drain electrode 7 in the organic semiconductor film 5. On the other hand, a pair of elements that are disposed in the respective regions opposed to the source electrode 6 and the drain electrode 7 on the two sides of the main gate electrode 2 serves as the auxiliary gate electrodes 4.

The main gate electrode 2 and the auxiliary gate electrodes 4 are electrically separated from each other. That is, the auxiliary gate electrodes 4 are located at higher positions than the main gate electrode 2 with respect to the upper surface of the substrate 1, and the gate insulating film 3 exists between the main gate electrode 2 and the auxiliary gate electrodes 4. In other words, the thickness of the gate insulating film 3 present between the main gate electrode 2 and the organic semiconductor film 5, that is, a main gate insulating film thickness dmain1, is larger than the thickness of the gate insulating film 3 present between the auxiliary gate electrodes 4 and the organic semiconductor film 5, that is, an auxiliary gate insulating film thickness dsub1.

Figure 2:
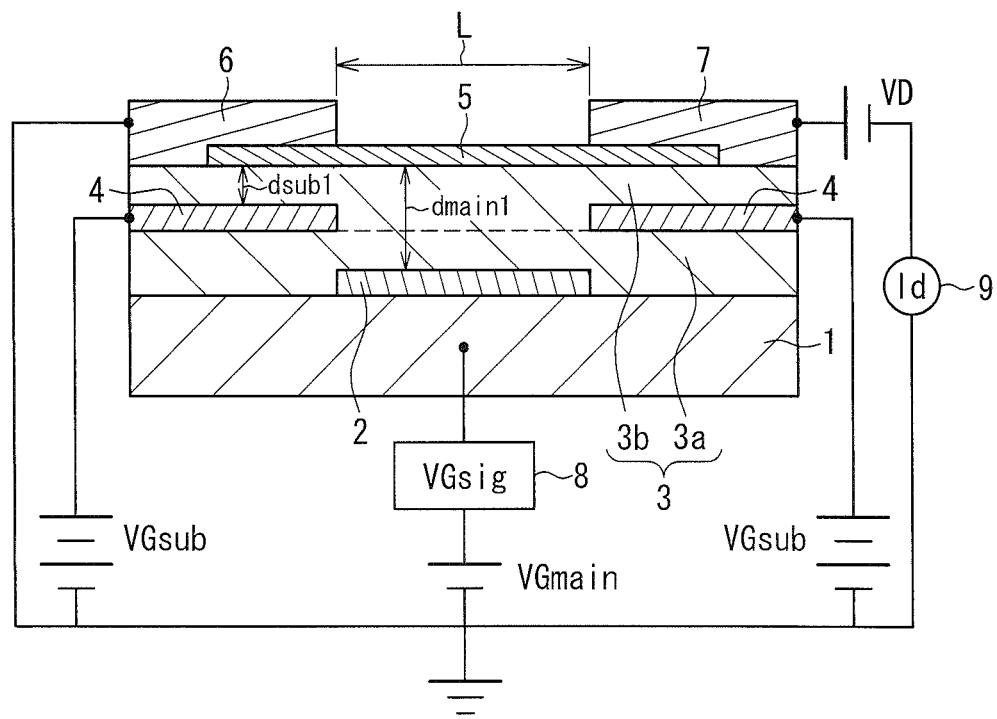
FIG. 2 is a circuit diagram illustrating an example of a method for driving the organic TFT.

FIG. 2 shows an example of a circuit for driving the organic TFT. That is, a main gate voltage VGmain that is a constant direct-current voltage and a modulation voltage VGsig from a modulation driving portion 8 are applied to the main gate electrode 2. However, the main gate voltage VGmain and the modulation voltage VGsig are not necessarily supplied separately, and a signal including a direct-current component and a modulation component may be produced and supplied. An auxiliary gate voltage VGsub that is a constant direct-current voltage is applied to the auxiliary gate electrodes 4 independently of the voltage applied to the main gate electrode 2. A drain voltage VD is applied to the drain electrode 7. It should be noted that an ammeter 9 indicates the measurement position when the cutoff frequency property actually is measured, which will be described later. A channel length L indicates a length of a channel region of the organic semiconductor film 5.

With the organic TFT configured in this manner, the channel resistance of the organic semiconductor film 5 is controlled by the main gate voltage VGmain and the modulation voltage VGsig applied to the main gate electrode 2. On the other hand, a high potential electric field always is formed in the interfacial region between the organic semiconductor film 5 and the source electrode 6 and drain electrode 7 by the auxiliary gate voltage VGsub. Thus, the contact resistance between the organic semiconductor film 5 and the source electrode 6 and drain electrode 7 is controlled so as to be at a low level.

The contact resistance and the channel resistance are respectively controlled by the separate gate electrodes 2 and 4 in this manner, thus making it possible to control the channel resistance while suppressing the influence from the contact resistance to a sufficiently low level. That is, the operation with a sufficiently low contact resistance is theoretically possible even in a drive in a low voltage region. Accordingly, it is possible to increase the effective mobility of the transistor in a device having a short channel length L required for a high-speed operation, and to obtain an organic TFT capable of being driven with a remarkably high operation frequency.

In order to obtain a sufficient an effect for reducing the contact resistance between the organic semiconductor film 5 and the source electrode 6 and drain electrode 7, it is desirable to set the electric field between the auxiliary gate electrodes 4 and the organic semiconductor film 5 to be stronger than the electric field between the main gate electrode 2 and the organic semiconductor film 5. That is, it is desirable to set the levels of the auxiliary gate voltage VGsub and the main gate voltage VGmain, the main gate insulating film thickness dmain1, and the auxiliary gate insulating film thickness dsub1 so as to satisfy the relationship in which VGsub/dsub1 is sufficiently larger than VGmain/dmain1. When this condition is satisfied, the contact resistance between the organic semiconductor film 5 and the source electrode 6 and drain electrode 7 can be reduced sufficiently and a high transconductance can be obtained with a small gate voltage, and therefore, this is extremely effective for a high-speed operation.

That is, the above-described settings make it possible sufficiently to reduce the contact resistance with the VGsub (electric field of VGsub/dsub1) without increasing the VGmain (electric field of VGmain/dmain1) and to provide a high mobility. This makes it possible for a transistor drive of operate at a high speed even if the VGmain is a small value, and this is effective for a high-speed operation of a logical operation element.

When the relationship is expressed as VGsub/dsub1>k× (VGmain/dmain1), the larger the value k is, the more desirable it is theoretically. However, the value k is actually determined by the drive range of the VGsig and the withstand voltage property of the gate insulating film 3, and the practical value of k is about 3 to 6 under the current circumstances.

In addition, with the above-described configuration, the main gate electrode 2 is opposed to the channel region, whereas the auxiliary gate electrodes 4 are disposed on the two sides of the channel region so as to be opposed to the source electrode 6 and the drain electrode 7, and are opposed to regions that are different from each other. Therefore, the parasitic capacitance between the main gate electrode 2 and the auxiliary gate electrodes 4 is small, and a high-speed responsiveness is less affected. In order to maximize such an effect, the main gate electrode 2 and the auxiliary gate electrodes 4 are formed such that there is no area in which they overlap each other when viewed in the direction orthogonal to the organic semiconductor film 5 (direction orthogonal to the film surface).

Figure 3:
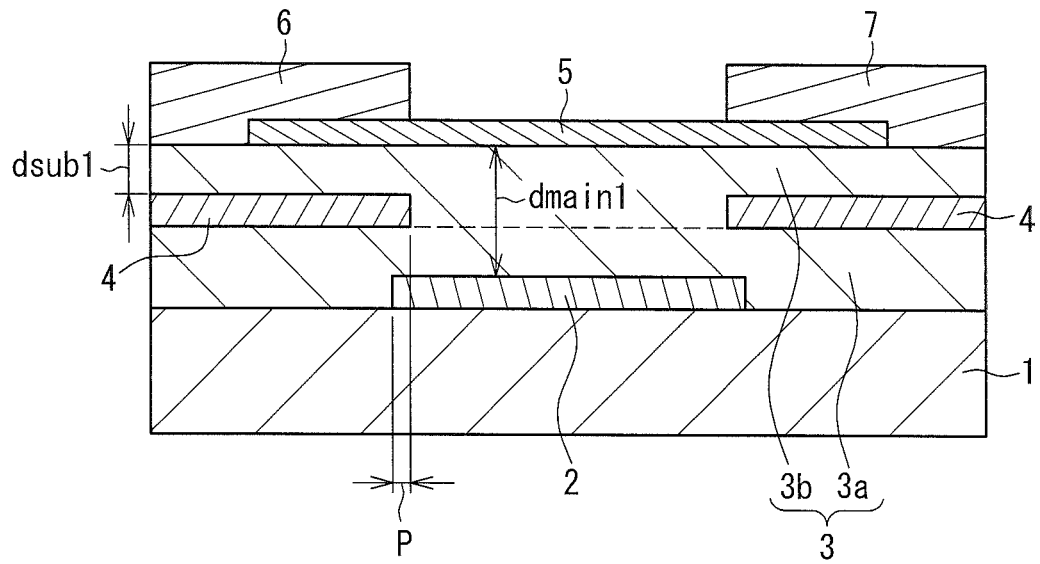
FIG. 3 is a cross-sectional view of a modified example of the organic TFT.

However, there may be an area P in which the main gate electrode 2 and the auxiliary gate electrodes 4 slightly overlap each other when viewed in the direction orthogonal to the film surface as shown in FIG. 3. In this case, the above-described functional effects are not substantially affected. Accordingly, some errors are allowable in formation of an electrode pattern. However, it is desirable that a state in which there is a gap between the main gate electrode 2 and the auxiliary gate electrodes 4 when viewed in the direction orthogonal to the film surface is avoided as much as possible.

Figure 4A:
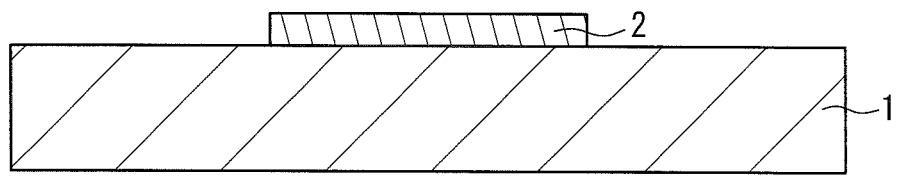
FIG. 4A is a cross-sectional view illustrating part of steps of the method for producing the organic TFT.

Next, an example of a method for producing the organic TFT configured as shown in FIG. 1 will be described with reference to cross-sectional views illustrating steps shown in FIGS. 4A to 4F. First, as shown in FIG. 4A, the main gate electrode 2 is formed on the substrate 1. The main gate electrode 2 is produced by patterning a film made of metal such as Au, Al, Cr, Cu, and Mo by photo lithography or the like.

Figure 4B:
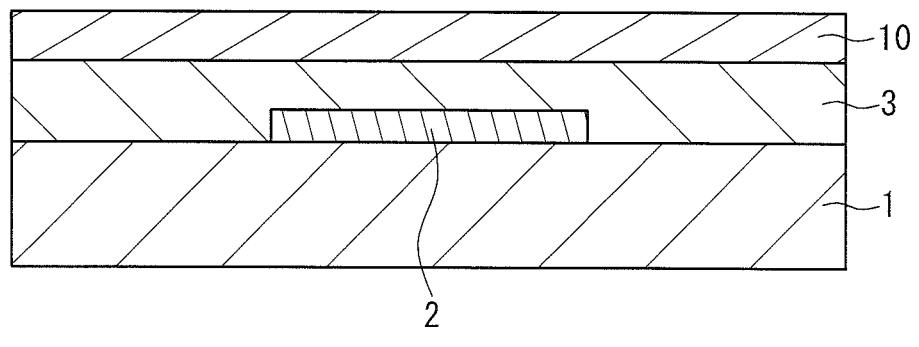
FIG. 4B is a cross-sectional view illustrating a step of the production method subsequent to the step shown in FIG. 4A.

Next, as shown in FIG. 4B, the lower insulating film 3a is formed so as to cover the main gate electrode 2. The lower insulating film 3a is a film constituting the first layer configuring the gate insulating film 3, and can be made up of, for example, a polymer insulating film such as Cytop (amorphous fluorine resin, registered trademark) and BCB (benzocyclobutene), or an inorganic insulating film such as $Al_2O_3$ and $SiO_2$. Furthermore, a photoresist layer 10 is formed on the lower insulating film 3a.

Figure 4C:
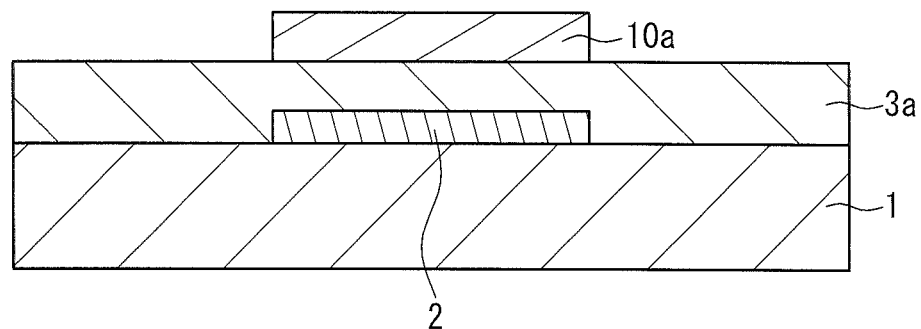
FIG. 4C is a cross-sectional view illustrating a step of the production method subsequent to the step shown in FIG. 4B.
Figure 4D:
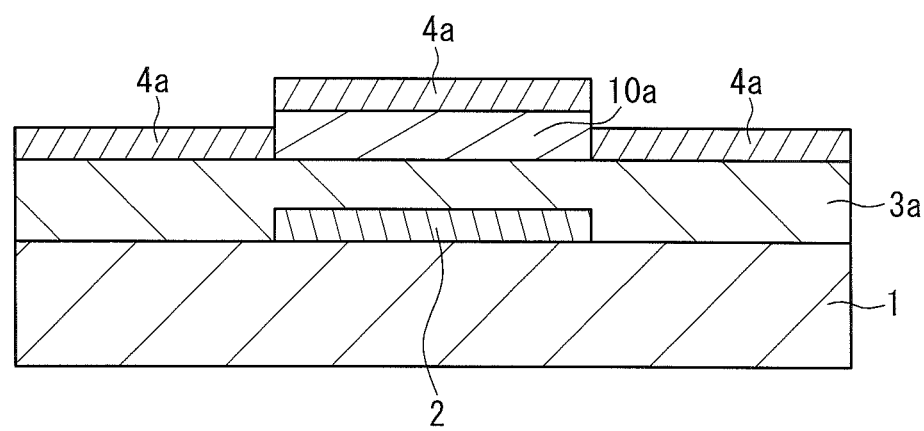
FIG. 4D is a cross-sectional view illustrating a step of the production method subsequent to the step shown in FIG. 4C.

Next, a back exposure process in which the back surface side of the substrate 1 is irradiated with exposure light 11 is performed using the main gate electrode 2 as a photomask. Then, development treatment is performed to pattern the photoresist layer 10, and a resist pattern 10a is formed as shown in FIG. 4C. With this back exposure process, it is possible to form the resist pattern 10a in a self-aligned manner with respect to the main gate electrode 2. Next, as shown in FIG. 4D, a metal film 4a (film for the auxiliary gate electrodes 4) made of Au, Al, Cr, Cu, Mo, or the like is formed so as to cover the entire surface including the resist pattern 10a.

Figure 4E:
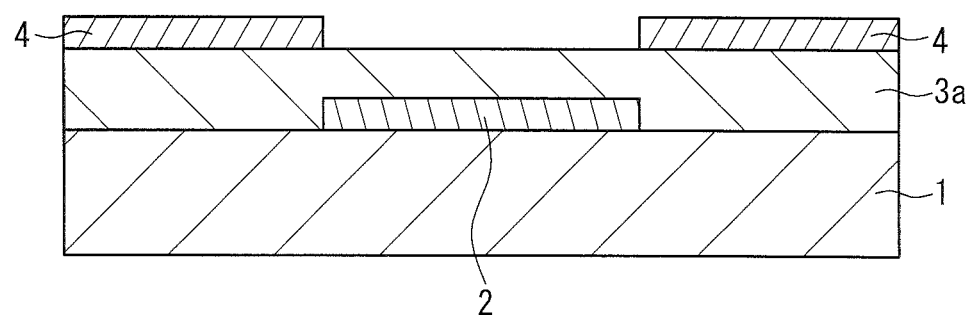
FIG. 4E is a cross-sectional view illustrating a step of the production method subsequent to the step shown in FIG. 4D.

Next, the resist pattern 10a is removed with a resist peeling liquid. As shown in FIG. 4E, a portion of the metal film 4a that is placed on the resist pattern 10a is thereby removed by lift-off, and thus the auxiliary gate electrodes 4 are patterned. As a result, the main gate electrode 2 and the auxiliary gate electrodes 4 are formed in a self-aligned manner.

Figure 4F:
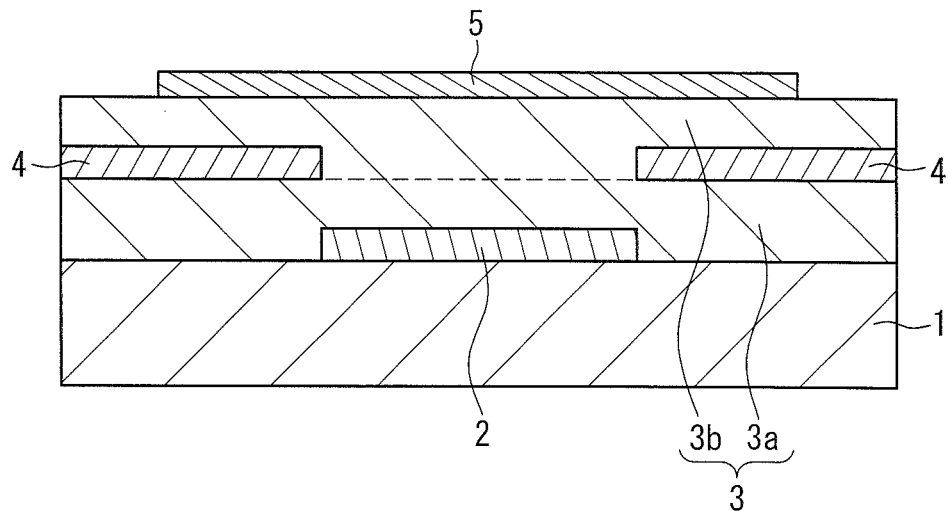
FIG. 4F is a cross-sectional view illustrating a step of the production method subsequent to the step shown in FIG. 4E.

Next, as shown in FIG. 4F, the upper insulating film 3b is formed so as to cover the auxiliary gate electrodes 4. The upper insulating film 3b is a film constituting the second layer configuring the gate insulating film 3, and can be made up of, for example, a polymer insulating film such as Cytop and BCB, or an inorganic insulating film such as $Al_2O_3$ and $SiO_2$. Furthermore, the organic semiconductor film 5 (e.g., pentacene, DNTT (dinaphthothienothiophene), and alkyl DNTT) is formed on the upper insulating film 3b. Lastly, the source electrode 6 and the drain electrode 7 are produced, as shown in FIG. 1, using Au or the like on the upper surface of the end portions of the organic semiconductor film 5 by using a shadow mask or photo lithography.

As described above, with this production method, it is possible to form the auxiliary gate electrodes 4 in a self-aligned manner with respect to the main gate electrode 2, and easily to reduce the parasitic capacitance due to the gate electrodes. This makes it possible to produce a high-speed operation organic TFT capable of operating with a remarkably high operation frequency in a low drive voltage region compared with a conventional method. However, an other known method can be used as a method for forming the auxiliary gate electrodes 4 in a self-aligned manner with respect to the main gate electrode 2.

Next, an example of an actual measurement of the cutoff frequency property of the organic TFT configured as described above will be described with reference to FIG. 5.

[1] Element Configuration of Organic TFT Subjected to Measurement
    Main gate electrode 2: Au
    Lower insulating film 3a: $Al_2O_3$, 200 nm
    Auxiliary gate electrode 4: Au
    Upper insulating film 3b: $Al_2O_3$, 100 nm
    Organic semiconductor film 5: Applied crystal film of $C_{10}$-DNTT
    Source electrode 6, drain electrode 7: Au
    Channel length L: no more than 2 μm

Figure 5:
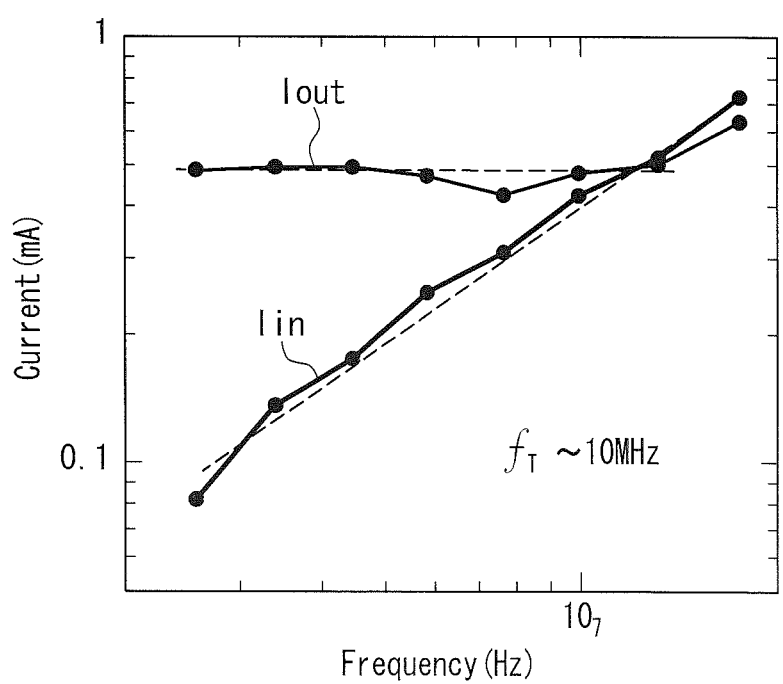
FIG. 5 is a diagram illustrating an example of an actual measurement of the cutoff frequency property of the organic TFT.

[2] Measurement Condition
    Voltage of auxiliary gate electrode 4: VGsub=−20 V
    Voltage of drain electrode 7: VD=−10 V
    Voltage of main gate electrode 2: Sinusoidal voltage with main gate voltage VGmain=−5 V, and modulation voltage VGsig=1 $V_{P-P}$ FIG. 5 shows the results of the simultaneous measurements of an input current (Iin) into the main gate electrode 2 and a transistor output current (drain current, Iout) with the above-described setting. In FIG. 5, the horizontal axis indicates the frequency (Hz) of the modulation voltage VGsig and the vertical axis indicates the current ($mA_{pp}$).

A current gain cutoff frequency ($f_T$) is defined as the frequency at which the relationship Iin=Iout is satisfied. As a result of the measurement, it was found that a high operation frequency with $f_T$ of 10 MHz or less was obtained. This is a remarkably high operation frequency for a coating type organic TFT compared with about 2 MHz for a conventional example.

Next, an example in which the features of the organic TFT configured as described above are applied to a bottom contact type organic TFT will be described with reference to FIG. 6. This organic TFT has the same configuration in which the main gate electrode 2, the auxiliary gate electrodes 4, and the gate insulating film 3 are formed on the insulating substrate 1 as that of the top contact type organic TFT shown in FIG. 1.

Figure 6:
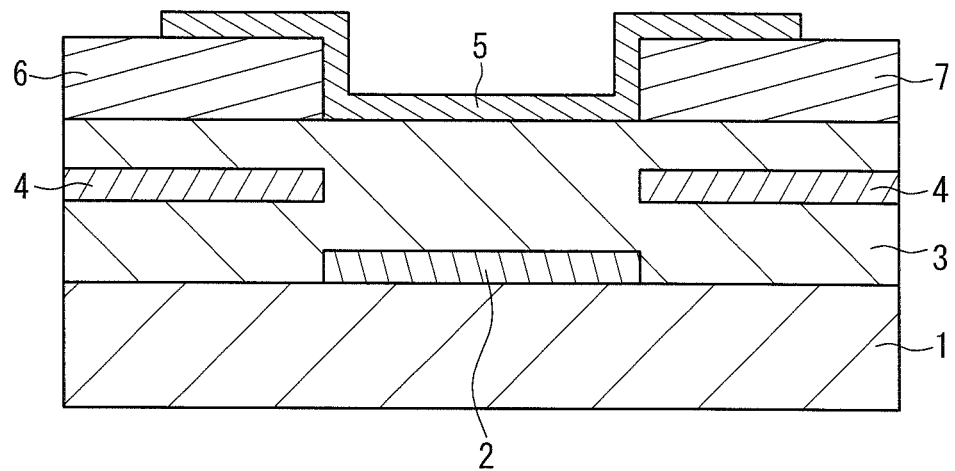
FIG. 6 is a cross-sectional view illustrating another embodiment of the structure of the organic TFT.

In the example shown in FIG. 6, the source electrode 6 and the drain electrode 7 are formed on the upper surface of the gate insulating film 3 with a gap provided therebetween in a range corresponding to the channel region. Then, the organic semiconductor film 5 is formed such that the end portions thereof are disposed on the upper surfaces of the source electrode 6 and the drain electrode 7.

As described above, a mutual relationship between the main gate electrode 2 and the auxiliary gate electrodes 4 is exactly the same as that in the configuration shown in FIG. 1, and it is possible to obtain the same effect by using the above drive method described with reference to FIG. 2.

Embodiment 2

Figure 7:
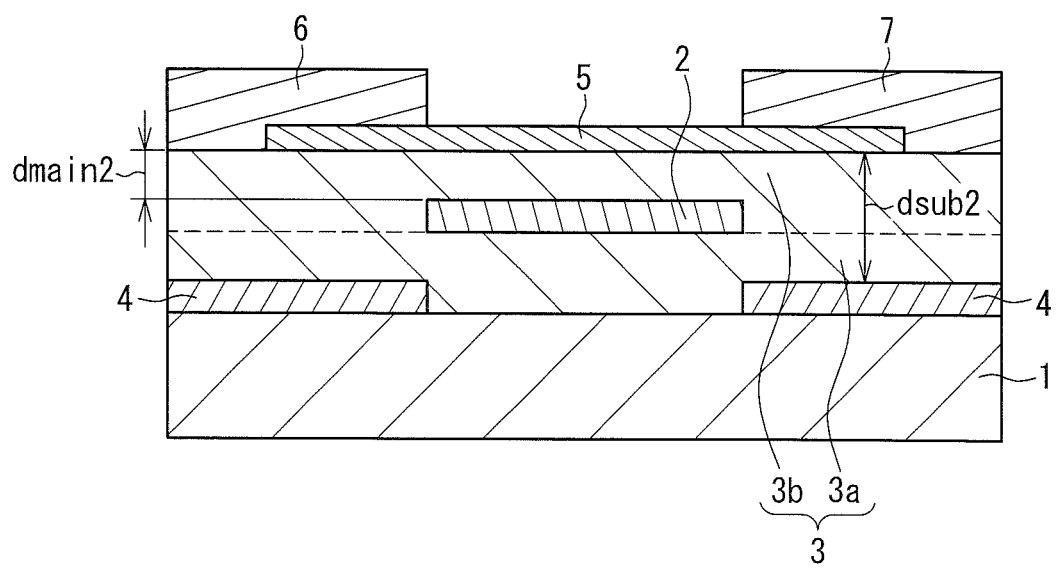
FIG. 7 is a cross-sectional view illustrating a structure of an organic TFT according to Embodiment 2.

FIG. 7 is a cross-sectional view illustrating the structure of an organic TFT according to Embodiment 2. The element structure thereof is the same as that of Embodiment 1, except that a positional relationship between the main gate electrode 2 and the auxiliary gate electrodes 4 in the direction of the thickness of the elements is different from that of Embodiment 1. Accordingly, the components identical to those of Embodiment 1 are denoted with the identical reference numerals and descriptions thereof are simplified.

The auxiliary gate electrodes 4 are first disposed on the insulating substrate 1, and the lower insulating film 3a is formed so as to cover the auxiliary gate electrodes 4. The main gate electrode 2 is formed on the upper surface of the lower insulating film 3a, and the upper insulating film 3b is formed so as to cover the upper surface of the main gate electrode 2. This configuration makes it possible to achieve a state in which the main gate electrode 2 and the auxiliary gate electrodes 4 are disposed in the gate insulating film 3 so as to be electrically separated from each other. The organic semiconductor film 5, the source electrode 6, and the drain electrode 7 are provided on the upper insulating film 3b.

In this configuration as well, the main gate electrode 2 is disposed in a region opposed to a channel region between the source electrode 6 and the drain electrode 7 in the organic semiconductor film 5. On the other hand, the auxiliary gate electrodes 4 are disposed in the respective regions opposed to the source electrode 6 and the drain electrode 7 on the two sides of the main gate electrode 2, and the auxiliary gate electrodes 4 and the main gate electrode 2 are electrically separated from each other. The thickness of the gate insulating film 3 present between the main gate electrode 2 and the organic semiconductor film 5, that is, a main gate insulating film thickness dmain2, is smaller than the thickness of the gate insulating film 3 present between the auxiliary gate electrodes 4 and the organic semiconductor film 5, that is, an auxiliary gate insulating film thickness dsub2.

A circuit for driving this organic TFT is configured basically in the same manner as that shown in FIG. 2. The channel resistance of the organic semiconductor film 5 is controlled by the main gate voltage VGmain and the modulation voltage VGsig applied to the main gate electrode 2, and the contact resistance between the organic semiconductor film 5 and the source electrode 6 and drain electrode 7 is controlled by the auxiliary gate voltage VGsub so as to be at a low level. Thus, the operation with a sufficiently low contact resistance is theoretically possible even with a drive in a low voltage region in the same manner as in Embodiment 1. Accordingly, it is possible to increase the effective mobility of the transistor in a device having a short channel length L, and to drive the organic TFT with a remarkably high operation frequency.

In order to obtain a sufficiently effect for reducing the contact resistance between the organic semiconductor film 5 and the source electrode 6 and drain electrode 7, it is desirable to set the electric field between the auxiliary gate electrodes 4 and the organic semiconductor film 5 to be stronger than the electric field between the main gate electrode 2 and the organic semiconductor film 5. That is, it is desirable to set the levels of the auxiliary gate voltage VGsub and the main gate voltage VGmain, the main gate insulating film thickness dmain2, and the auxiliary gate insulating film thickness dsub2 so as to satisfy the relationship in which VGsub/dsub2 is sufficiently larger than VGmain/dmain2. When this condition is satisfied, the contact resistance between the organic semiconductor film 5 and the source electrode 6 and drain electrode 7 can be reduced sufficiently and a high transconductance can be obtained with a small gate voltage, and therefore, this is extremely effective for a high-speed operation.

In addition, the main gate electrode 2 and the auxiliary gate electrodes 4 are opposed to regions that are different from each other, and therefore, the parasitic capacitance between the main gate electrode 2 and the auxiliary gate electrodes 4 is small, and a high-speed responsiveness is less affected. In order to obtain such an effect at the maximum level, the main gate electrode 2 and the auxiliary gate electrodes 4 are formed such that there is no area in which they overlap each other when viewed in the direction orthogonal to the film surface. However, there may be an area in which the main gate electrode 2 and the auxiliary gate electrodes 4 slightly overlap each other when viewed in the direction orthogonal to the film surface in the same manner as in Embodiment 1. Moreover, it is desirable that a state in which there is a gap between the main gate electrode 2 and the auxiliary gate electrodes 4 when viewed in the direction orthogonal to the film surface is avoided as much as possible.

Next, an example of a method for producing the organic TFT configured as shown in FIG. 7 will be described with reference to cross-sectional views illustrating steps shown in FIGS. 8A to 8F.

Figure 8A:
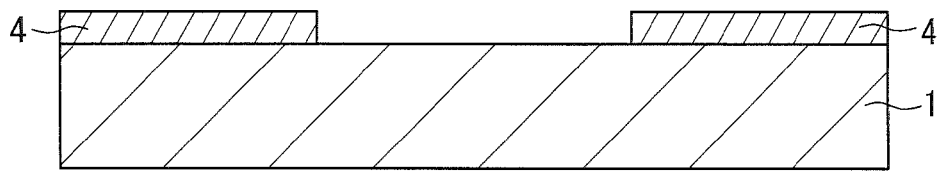
FIG. 8A is a cross-sectional view illustrating part of steps of the method for producing the organic TFT.
Figure 8B:
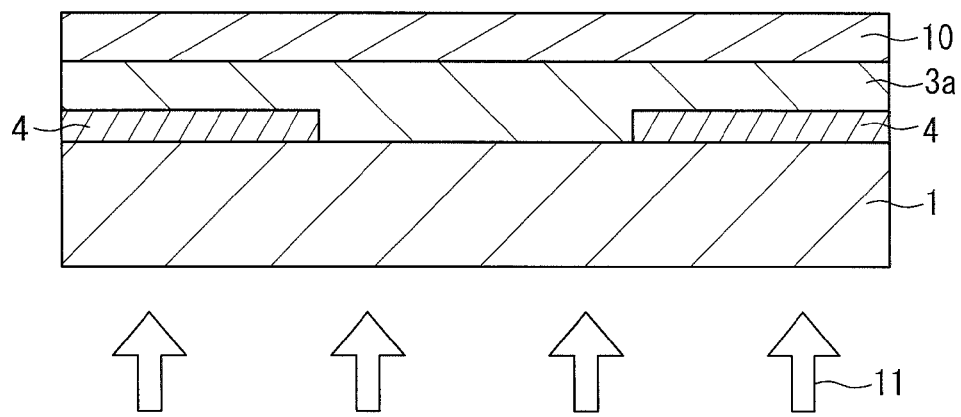
FIG. 8B is a cross-sectional view illustrating a step of the production method subsequent to the step shown in FIG. 8A.

First, as shown in FIG. 8A, the auxiliary gate electrodes 4 are formed on the substrate 1. The auxiliary gate electrodes 4 are produced by patterning a film made of metal such as Au, Al, Cr, Cu, and Mo by photo lithography or the like. Next, as shown in FIG. 8B, the lower insulating film 3a is formed so as to cover the auxiliary gate electrodes 4. The lower insulating film 3a can be made up of, for example, a polymer insulating film such as Cytop (registered trademark) and BCB, or an inorganic insulating film such as $Al_2O_3$ and $SiO_2$. Furthermore, the photoresist layer 10 is formed on the lower insulating film 3a.

Figure 8C:
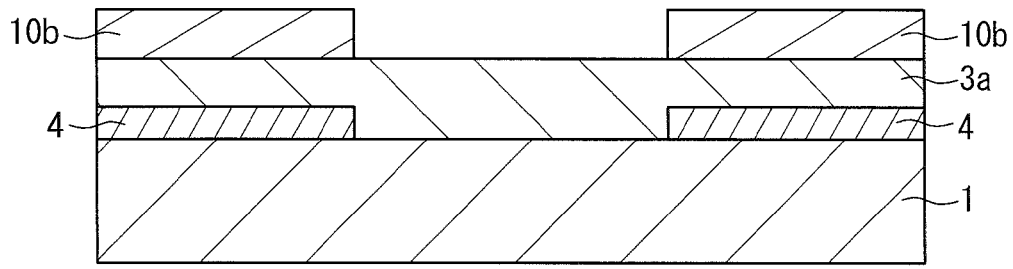
FIG. 8C is a cross-sectional view illustrating a step of the production method subsequent to the step shown in FIG. 8B.
Figure 8D:
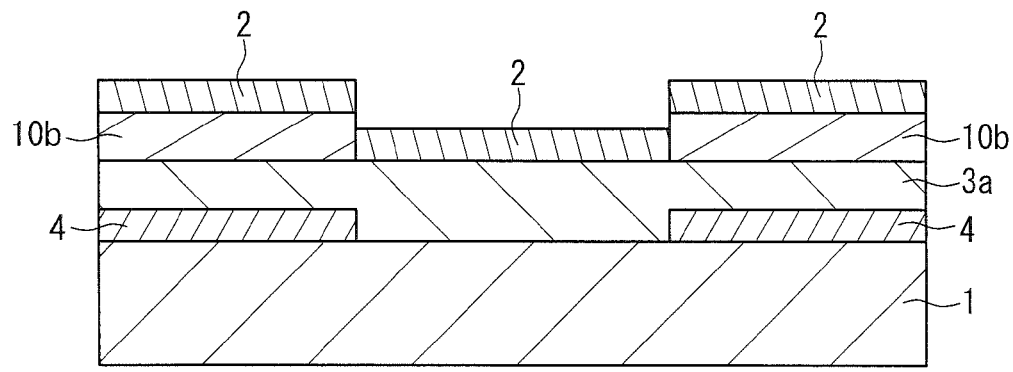
FIG. 8D is a cross-sectional view illustrating a step of the production method subsequent to the step shown in FIG. 8C.

Next, a back exposure process from the back surface side of the substrate 1 is performed using the auxiliary gate electrodes 4 as a photomask. Then, development is performed to pattern the photoresist layer 10, and a resist pattern 10b is formed as shown in FIG. 8C. With this back exposure process, it is possible to pattern the resist pattern 10b in a self-aligned manner with respect to the auxiliary gate electrodes 4. Next, as shown in FIG. 8D, a metal film 2a for forming the main gate electrode 2 that is made of Au, Al, Cr, Cu, Mo, or the like is formed so as to cover the entire surface including the resist pattern 10b.

Figure 8E:
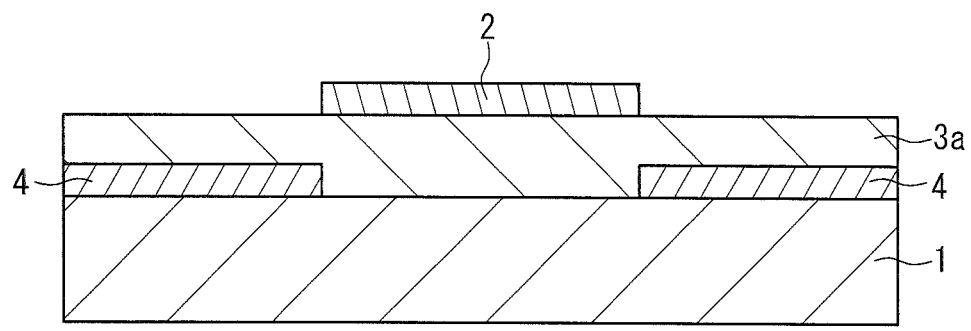
FIG. 8E is a cross-sectional view illustrating a step of the production method subsequent to the step shown in FIG. 8D.

Next, the resist pattern 10b is removed with a resist peeling liquid. As shown in FIG. 8E, a portion of the metal film 2a that is placed on the resist pattern 10b is thereby removed by lift-off, and thus the main gate electrode 2 is patterned. As a result, the main gate electrode 2 and the auxiliary gate electrodes 4 are formed in a self-aligned manner.

Figure 8F:
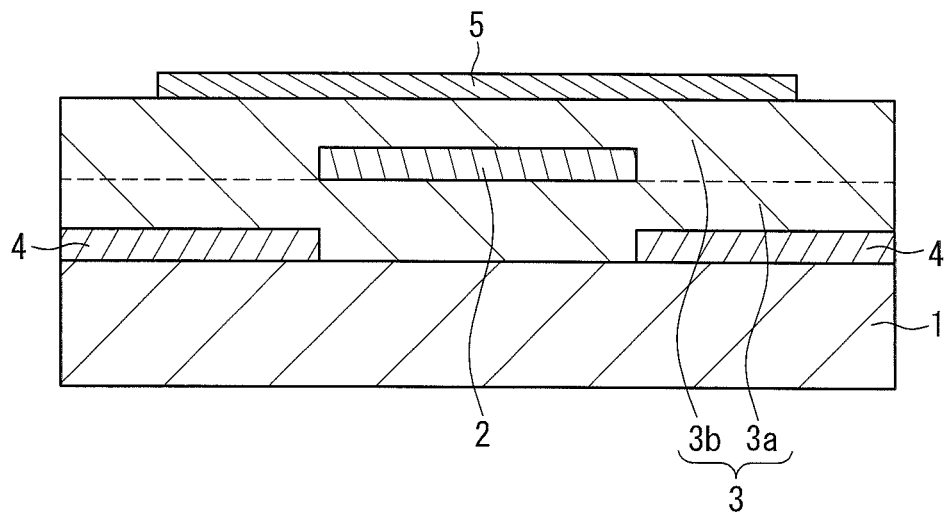
FIG. 8F is a cross-sectional view illustrating a step of the production method subsequent to the step shown in FIG. 8E.

Next, as shown in FIG. 8F, the upper insulating film 3b is formed so as to cover the main gate electrode 2. The upper insulating film 3b is made up of, for example, a polymer insulating film such as Cytop and BCB, or an inorganic insulating film such as $Al_2O_3$ and $SiO_2$. Furthermore, the organic semiconductor film 5 (e.g., pentacene, DNTT (dinaphthothienothiophene), and alkyl DNTT) is formed on the upper insulating film 3b. Lastly, the source electrode 6 and the drain electrode 7 are produced using Au or the like on the upper surface of the end portions of the organic semiconductor film 5 by using a shadow mask or photo lithography (see FIG. 7).

As described above, with this production method, it is possible to form the main gate electrode 2 in a self-aligned manner with respect to the auxiliary gate electrodes 4, and easily to reduce the parasitic capacitance due to the gate electrodes. In this embodiment as well, this makes it possible to produce a high-speed operation organic TFT capable of operating with a remarkably high operation frequency in a low drive voltage region.

Next, an example in which the features of the organic TFT configured as described above are applied to a bottom contact type organic TFT will be described with reference to FIG. 9. This organic TFT has the same configuration in which the auxiliary gate electrodes 4, the main gate electrode 2, and the gate insulating film 3 are formed on the insulating substrate 1 as that of the top contact type organic TFT shown in FIG. 7.

Figure 9:
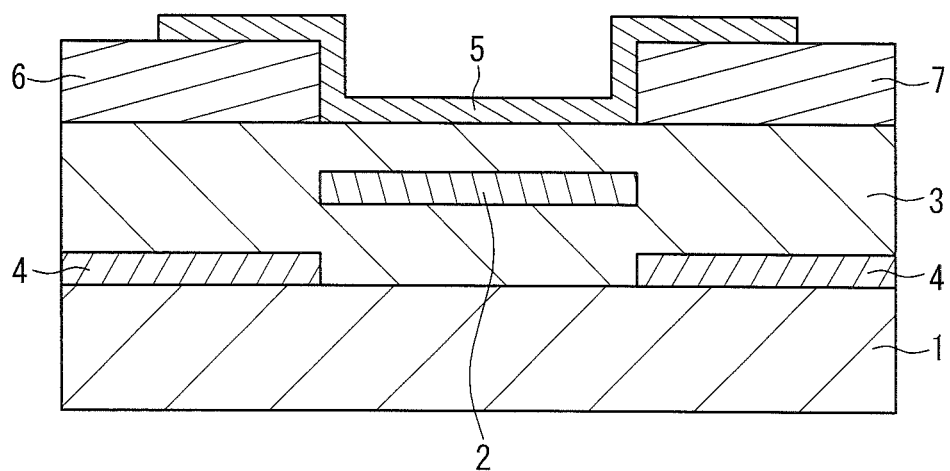
FIG. 9 is a cross-sectional view illustrating another embodiment of the structure of the organic TFT.

In the example shown in FIG. 9, the source electrode 6 and the drain electrode 7 are formed on the upper surface of the gate insulating film 3 with a gap provided therebetween in a range corresponding to the channel region. Then, the organic semiconductor film 5 is formed such that the end portions thereof are disposed on the upper surfaces of the source electrode 6 and the drain electrode 7.

As described above, a mutual relationship between the main gate electrode 2 and the auxiliary gate electrodes 4 is exactly the same as that in the configuration shown in FIG. 7, and it is possible to obtain the same effect by using the above drive method described with reference to FIG. 2.

INDUSTRIAL APPLICABILITY

An organic thin film transistor of the present invention can sufficiently enhance a high-speed response performance due to the channel length being shortened, and is useful for logical circuit elements in general that are required to operate at a high speed, such as an active matrix back plane that is necessary to drive an e-paper, liquid crystal, an organic EL display, and the like, a gate for driving pixels, a source driver circuit, and an RFID tag.

The invention claimed is:
1. An organic thin film transistor comprising:
an insulating substrate;
gate electrodes provided on the substrate;
a gate insulating film formed so as to cover the gate electrodes;
an organic semiconductor film formed on the gate insulating film; and
a source electrode and a drain electrode that are disposed so as to come into contact with the organic semiconductor film, wherein the gate electrodes comprises
  a main gate electrode that is disposed in a region opposed to a channel region in the organic semiconductor film between the source electrode and the drain electrode, and
  a pair of auxiliary gate electrodes that are disposed in respective regions opposed to the source electrode and the drain electrode and at first and second sides of the main gate electrode,
the main gate electrode and the auxiliary gate electrodes are formed in different layers of an insulating film from each other,
the insulating film is interposed between the main gate electrode and the auxiliary gate electrodes so as to electrically separate the main gate electrode and the auxiliary gate electrodes from each other, and
the gate insulating film comprises the insulating film.

2. The organic thin film transistor according to claim 1, wherein a thickness of the gate insulating film present between the main gate electrode and the organic semiconductor film is different from a thickness of the gate insulating film present between the auxiliary gate electrodes and the organic semiconductor film.

3. The organic thin film transistor according to claim 1, wherein a constant voltage is applied to the auxiliary gate electrodes, and
relationships between a thickness of the gate insulating film and voltages applied to the auxiliary gate electrodes and the main gate electrode are set so that an electric field between the auxiliary gate electrodes and the organic semiconductor film is stronger than an electric field between the main gate electrode and the organic semiconductor film.

4. The organic thin film transistor according to claim 1, wherein the main gate electrode and the auxiliary gate electrodes are formed such that there is no gap between end portions thereof when viewed in a direction orthogonal to the organic semiconductor film.

5. The organic thin film transistor according to claim 4, wherein the main gate electrode and the auxiliary gate electrodes are formed such that there is no area in which the main gate electrode and the auxiliary gate electrodes overlap each other when viewed in a direction orthogonal to the organic semiconductor film.

6. A method for producing the organic thin film transistor of claim 1, comprising:
  forming, a first gate electrode on the insulating substrate, as either of the main gate electrode and the auxiliary gate electrodes;
  forming a lower gate insulating film so as to cover the first gate electrode;
  forming a second gate electrode, which is the other of the main gate electrode and the auxiliary gate electrodes, on the lower gate insulating film;
  forming an upper gate insulating film so as to cover the second gate electrode and the lower gate insulating film; and
  forming an organic semiconductor film on the upper gate insulating film and forming a source electrode and a drain electrode so as to be in contact with the organic semiconductor film.

7. The method for producing an organic thin film transistor according to claim 6,
  wherein in the second gate forming step, the second gate electrode is patterned in a self-aligned manner with respect to the first gate electrode by a step including a back exposure from a back surface side of the substrate, the back exposure using the first gate electrode as a mask.

8. The method for producing an organic thin film transistor according to claim 6,
  wherein the gate insulating film is formed by separately forming a lower insulating film and an upper insulating film,
  the lower insulating film is formed so as to cover the first gate electrode after the first gate forming step,
  the second gate electrode is then formed on the lower insulating film by the second gate forming step, and
  the upper insulating film is then formed so as to cover the second gate electrode.

* * * * *